United States Patent
Silver et al.

(10) Patent No.: US 6,629,185 B1
(45) Date of Patent: Sep. 30, 2003

(54) ARCHITECTURE, CIRCUITRY AND METHOD OF TRANSFERRING DATA INTO AND/OR OUT OF AN INTERDIGITATED MEMORY ARRAY

(75) Inventors: John Silver, Monument, CO (US); Iulian Gradinariu, Colorado Springs, CO (US); Keith Ford, Colorado Springs, CO (US); Sean Mulholland, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/455,272

(22) Filed: Dec. 6, 1999

(51) Int. Cl.[7] .............................................. G06F 13/14
(52) U.S. Cl. ....................................................... 710/307
(58) Field of Search ................................ 710/307, 310, 710/316; 365/189.02, 189.03, 189.04; 711/150, 212

(56) References Cited

U.S. PATENT DOCUMENTS

| | | | | |
|---|---|---|---|---|
| 5,274,763 A | * | 12/1993 | Banks | 710/316 |
| 5,363,494 A | * | 11/1994 | Kudou | 710/307 |
| 5,761,456 A | * | 6/1998 | Titus et al. | 710/307 |
| 6,049,501 A | * | 4/2000 | Pantelakis et al. | 365/207 |
| 6,101,565 A | * | 8/2000 | Nishtala et al. | 710/307 |
| 6,311,239 B1 | * | 10/2001 | Matthews | 710/307 |

* cited by examiner

*Primary Examiner*—Glenn A. Auve
(74) *Attorney, Agent, or Firm*—Christopher P. Maiorana, P.C.

(57) ABSTRACT

An apparatus comprising a first bus, a second bus, a memory and one or more interconnections. The memory may be connected to the first bus and the second bus and may be configured to transfer data over the first bus and the second bus. The one or more interconnections may be connected between one or more data lines of the first bus and the second bus to control a bit-width of the first and second buses.

16 Claims, 5 Drawing Sheets

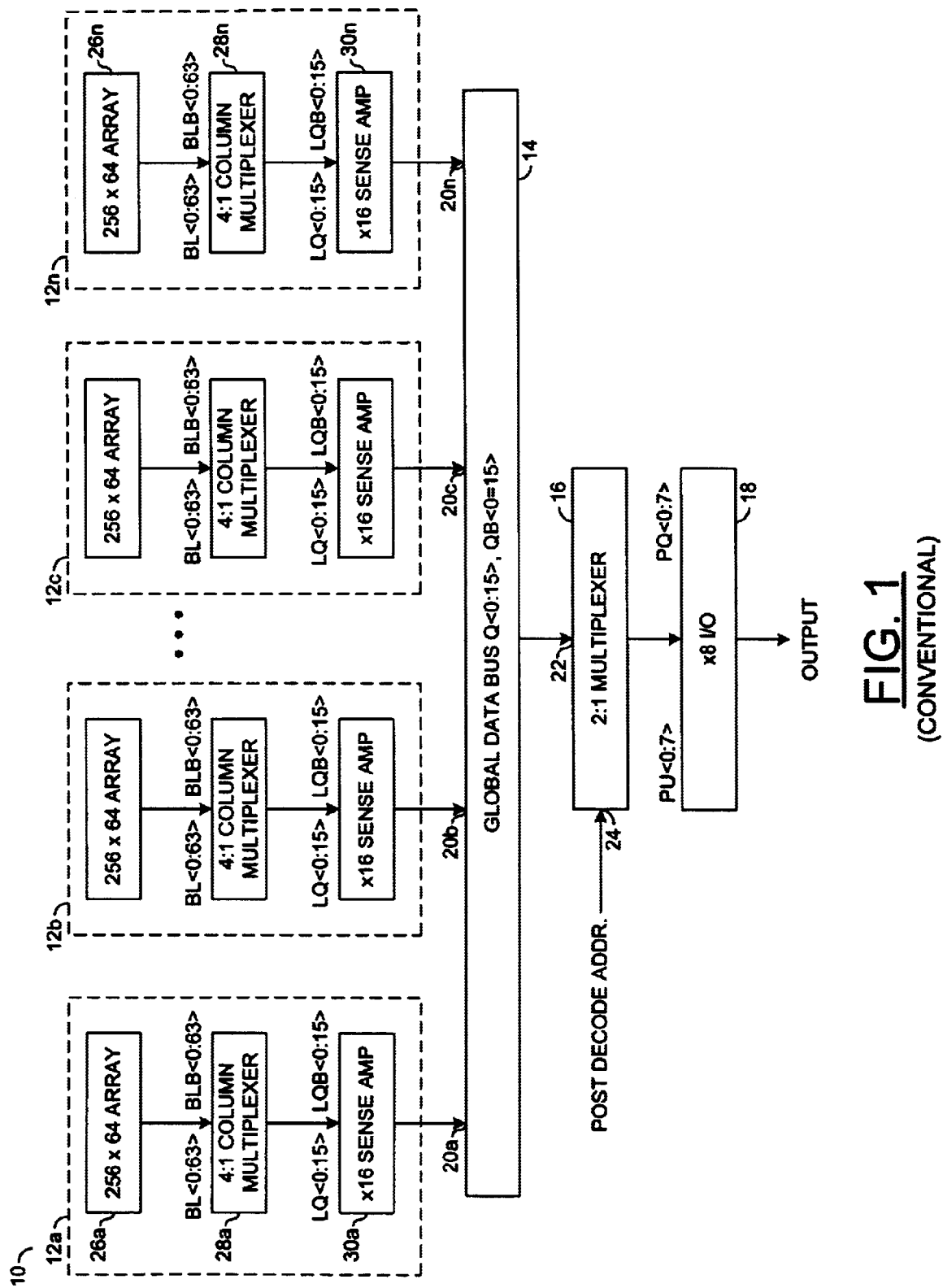
FIG. 1
(CONVENTIONAL)

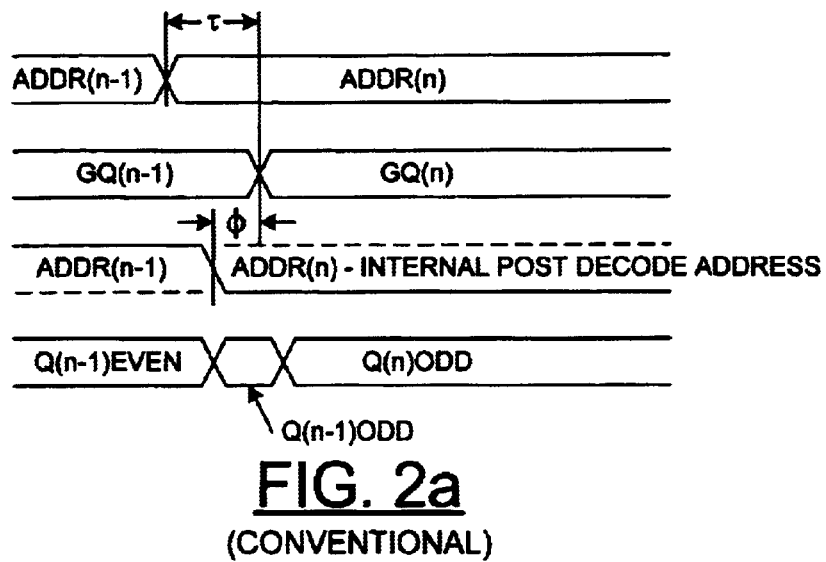
FIG. 2a
(CONVENTIONAL)
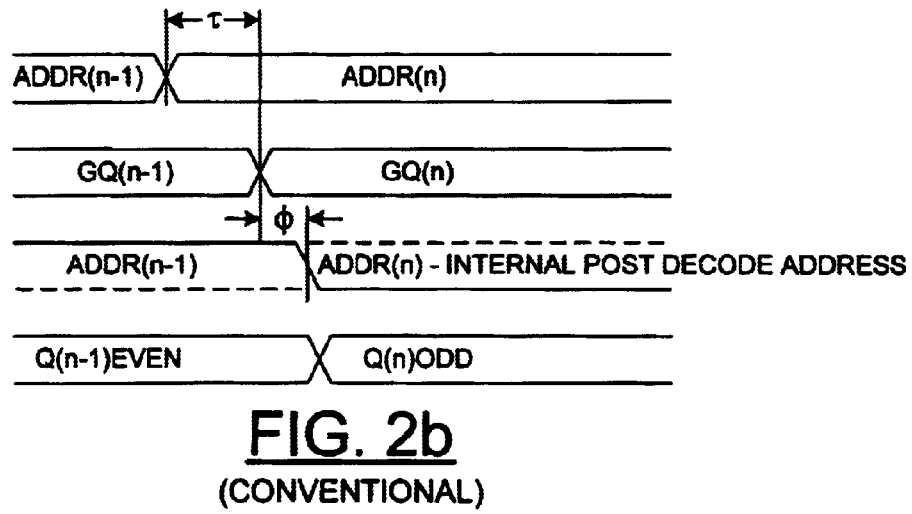
FIG. 2b
(CONVENTIONAL)
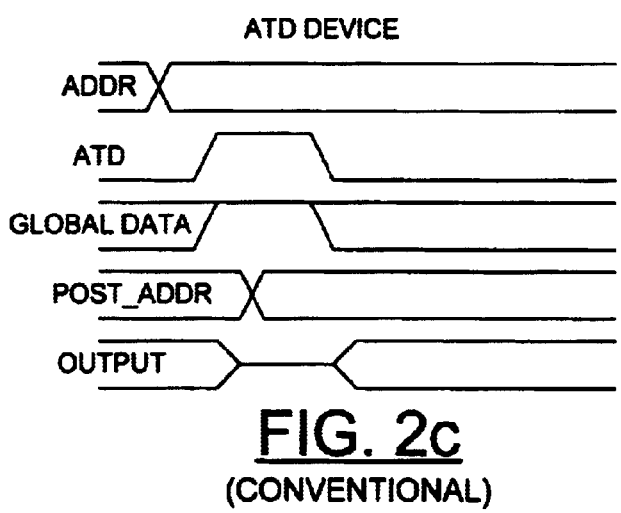
FIG. 2c
(CONVENTIONAL)

ARCHITECTURE, CIRCUITRY AND METHOD OF TRANSFERRING DATA INTO AND/OR OUT OF AN INTERDIGITATED MEMORY ARRAY

FIELD OF THE INVENTION

The present invention relates to post decoding of memory circuits generally and, more particularly, to a post decode method and/or architecture for memory circuits using an interdigitated array.

BACKGROUND OF THE INVENTION

Referring to FIG. 1, a conventional circuit 10 for post decoding of memory circuits is shown. The circuit 10 comprises a plurality of blocks 12a–12n, a global data bus 14, a multiplexer 16 and an I/O circuit 18. Each block 12a–12n presents a signal to an input 20a–20n of the global data bus 14. The global data bus 14 presents a signal to an input 22 of the multiplexer 16. The multiplexer 16 presents a signal to the I/O circuit 18 in response to the signal received at the input 22 and a signal POST_DECODE_ADDR received at an input 24. The I/O circuit 18 presents the signal OUTPUT in response to the signals received from the multiplexer 16.

The blocks 12a–12n comprise an array 26a–26n, a multiplexer 28a–28n and a sense amplifier 30a–30n. The array 26a is connected to the multiplexer 28a. The multiplexer 28a is connected to the sense amplifier 30a and will transfer data in response to the array 26a. The sense amplifier 30a is connected to an input 20a of the global data bus 14 and will transfer data in response to the multiplexer 28a.

Timing diagrams of the circuit 10 are shown in FIGS. 2a, 2b and 2c. The timing diagrams display the problem of race conditions that occur during operation of the circuit 10. The timing of the signal POST_ADDR is critical to the operation of the circuit 10. FIG. 2a defines a simplified timing diagram for a non-atd variant of device 10. The post decode address input to the multiplexer selects one of two bytes of data from the 16-bit global bus and passes the selected byte to the 8-bit I/O. As an example, a logic low level on post decode address will pass even bits of data, while a logic high level will pass odd bits of data. At some time (i.e., tau) after an address change, the data on the 16-bit global data bus will change to that of the selected address GQ(n). This data then passes through the multiplexer to the I/O. The timing of the post decode address is critical for proper functionality of the device. If the post decode address transitions prior to the global data transition, then the data from address n−1, GQ(n−1)odd, will be momentarily passed to the I/O. This will cause the outputs of the device to "glitch" to the incorrect data. This "glitch" is undesirable and can cause performance degradation and excessive noise. Conversely, if the post decode address transitions after the global data transition (FIG. 2b), then the data from address n is properly passed to the I/O. However, the time difference between the global data transition and the post decode data transition (i.e., phi) has a direct adverse impact on the access time of the device. Phi is directly additive to the Taa, or address access time of the device.

FIG. 2c defines a simplified timing diagram for an atd variant of device 10. This type of device generates an atd pulse as a result of an address transition. This atd pulse is used to equalize the data path of the device. As a result, the global data bus is equalized high (or low) during the pulse duration. By necessity the I/O is forced into a high impedance state by the equalized data path. This allows for time during which the post decode address can transition without passing erroneous data to the I/O. The internal post decode address must be positioned within this equalized state in order to avoid the glitches described for the non-atd device.

SUMMARY OF THE INVENTION

The present invention concerns an apparatus comprising a first bus, a second bus, a memory and one or more interconnections. The memory may be connected to the first bus and the second bus and may be configured to transfer data over the first bus and the second bus. The one or more interconnections may be connected between one or more data lines of the first bus and the second bus to control a bit-width of the first and second buses.

The objects, features and advantages of the present invention include providing a method and/or architecture that may (i) transform a memory with an internal bus width of N to a device with an external bus width of $N/2^m$ using the same base design, (ii) multiplex a single ended data path without inducing unnecessary output data transitions, (iii) have an access time which is not dependent on a post decode address speed, and/or (iv) define post decoding of memories with interdigitated arrays. In one example, the present invention may be used with differential data and a non-interdigitated array.

BRIEF DESCRIPTION OF THE DRAWINGS

These and other objects, features and advantages of the present invention will be apparent from the following detailed description and the appended claims and drawings in which:

FIG. 1 is a conventional block diagram for the post decoding of memory circuits;

FIGS. 2a–2c are timing diagrams of the circuit of FIG. 1;

DETAILED DESCRIPTION OF THE PREFERRED EMBODIMENTS

Figure 3:
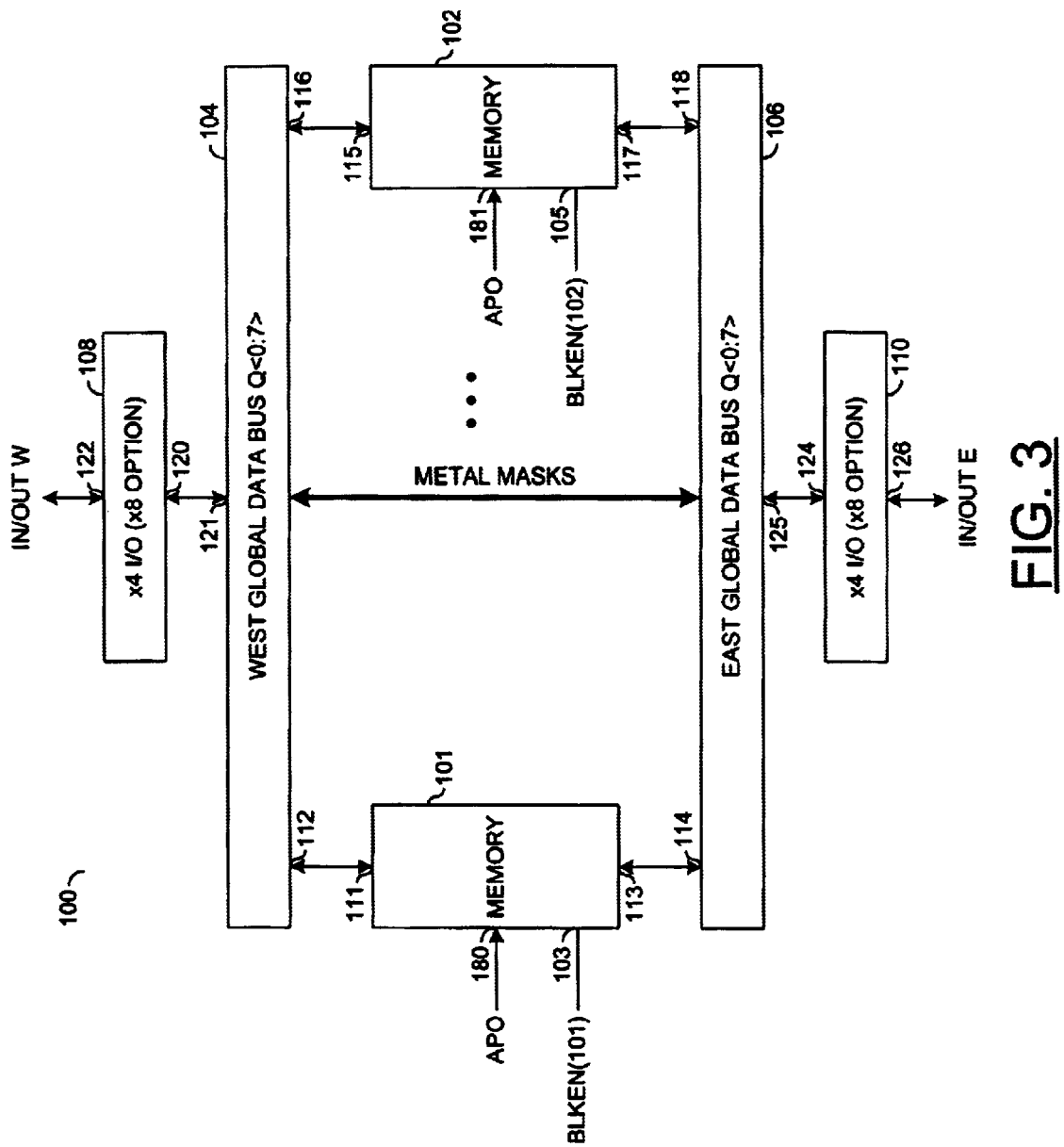
FIG. 3 is a block diagram of a preferred embodiment of the present invention.

Referring to FIG. 3, a block diagram of a circuit 100 is shown in accordance with a preferred embodiment of the present invention. The circuit 100 may allow post decoding of memory circuits using an interdigitated array (i.e., an array that may be alternately accessed from two sides) and single-ended data path. The circuit 100 may multiplex an internal data bus (either up or down) to an external data bus. The circuit 100 may multiplex the internal data bus by implementing multiple metal masks to option the bit-width of a data word to be stored/retrieved.

The circuit 100 generally comprises a memory 101, a memory 102, a bus 104, a bus 106, an I/O block (or circuit) 108 and an I/O block (or circuit) 110. While an example of the circuit 100 is described in connection with two memories (e.g., the memory 101 and the memory 102) a number of memories greater than two (or even a single memory) may be implemented accordingly to meet the design criteria of a particular implementation. The memories 101 and 102 may each be implemented, in one example, as interdigitated memory arrays. However, the memories 101 and 102 may be implemented as non-interdigitated arrays in certain design applications. The memories 101 and 102 (to be described in detail in connection with FIG. 4) generally allow the circuit 100 to operate efficiently without the use of a post decode address circuitry. The memories 101 and 102 may also eliminate critical timing problems associated with post decode address circuitry. Read and write circuitry (not shown) may be enabled in a selected memory 101 or 102 only during a particular read or write operation. An example of read and write circuitry that may be used with the present invention may be found in co-pending application (Ser. No. 09/398,735, filed Sep. 17, 1999), which is hereby incorporated by reference in its entirety.

In one example, the bus 104 may be implemented as a west global data bus and the bus 106 may be implemented as a east global data bus. However the bus 104 and the bus 106 may be implemented as any other bus type in order to meet the criteria of a particular implementation. The west global data bus 104 may be connected to the east global data bus 106 through one or more bi-directional connections (e.g., METAL MASK OPTIONS). The METAL MASK OPTIONS may allow change of the width of a data word. The METAL MASK OPTIONS may short particular portions (e.g., data lines) of the west and east global data buses 104 and 106. Address transition detection pulses within the memories 101 and 102 may prevent potential crowbar conditions when switching between west and east global data buses 104 and 106.

The memory 101 may present and/or receive data to and/or from the west global data bus 104 between an input/output 111 and an input/output 112. The memory 101 may present and/or receive data to and/or from the east global data bus 106 between an input/output 113 and an input/output 114. The memory 101 may present and/or receive data in response to a block enable signal (e.g., BLKEN(101)) received at an input 103 and an east/west address signal (e.g., AP0) received at an input 180. The memory 102 may present and/or receive data to and/or from the west global data bus 104 between an input/output 115 and an input/output 116. The memory 102 may present and/or receive data to and/or from the east global data bus 106 between an input/output 117 and an input/output 118. The memory 102 may present and/or receive data in response to the signal BLKEN(102) received at an input 105 and an east/west address signal (e.g., AP0) received at an input 181. The signal BLKEN may enable the read and write circuitry (not shown) in a selected memory 101 or 102. The signal AP0 may enable the read or write circuitry on the east or west side of memory 101 or 102. The memories 101 and 102 may each comprise an internal data bus (not shown). The internal data bus may have, in one example, a bit-width equal to two times the bit-width of the bus 104 and/or the bus 106. However, other bit-widths may be implemented accordingly to meet the design criteria of a particular implementation.

The west global data bus 104 may present data received from the memories 101 and 102 to the I/O circuit 108 between an input/output 120 and an input/output 121. The west global data bus 104 may also present data received from the I/O circuit 108 to the memories 101 and/or 102. The I/O circuit 108 may present a signal (e.g., IN/OUTW) at the input/output 122. The east global data bus 106 may present data received from the memories 101 and 102 to the I/O circuit 110 between an input/output 124 and an input/output 125. The east global data bus 106 may also present data received from the I/O circuit 110 to the memories 101 and 102. The I/O circuit 110 may present a signal (e.g., IN/OUTE) at an input/output 126. The I/O circuits 108 and 110 may be implemented as 4-bit I/O circuits, 8-bit I/O circuits or any other bit-width I/O circuits that may be appropriate to meet the criteria of a particular implementation.

Figure 4:
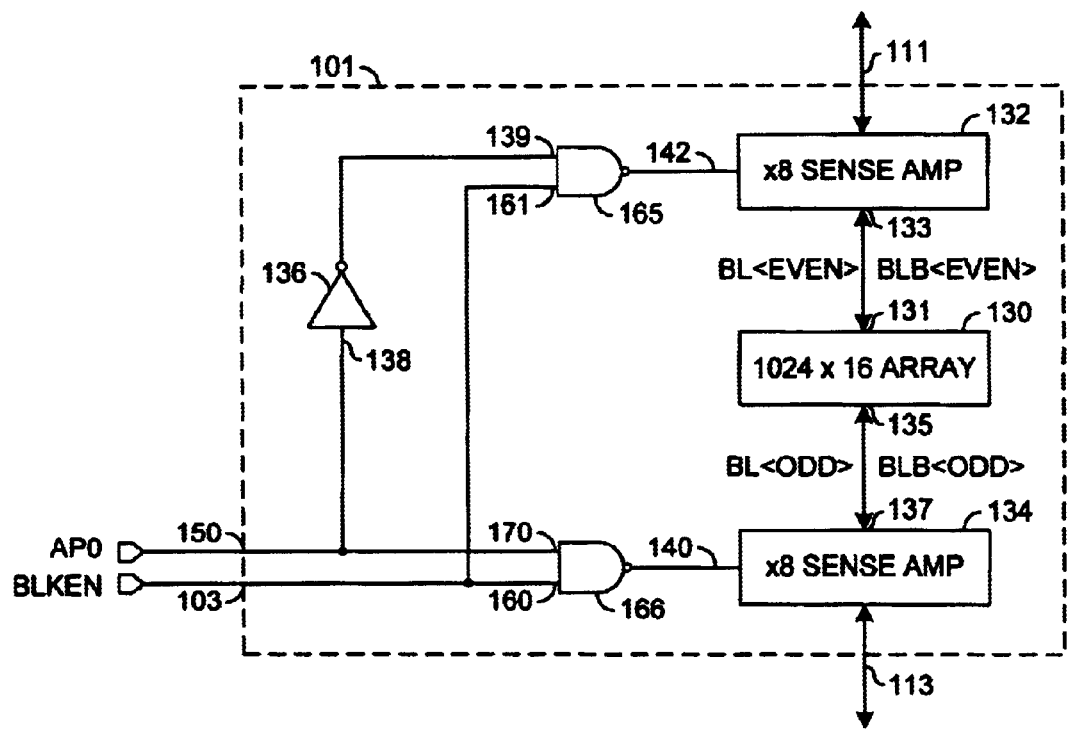
FIG. 4 is a detailed block diagram of a block array of FIG. 3.

Referring to FIG. 4 a detailed block diagram of the memory 101 of FIG. 3 is shown. The memory 102 has similar components as the memory 101. The memory 101 may comprise a memory array 130, a sense amplifier 132, a sense amplifier 134, an inverter 136, a nand gate 136 and a nand gate 165. The memory array 130 may be implemented, in one example, as an interdigitated array having a size of 1024×16. However, the memory array 130 may be implemented as various sized memories in order to meet the criteria of a particular implementation. The sense amplifiers 132 and 134 may each access the memory array 130. The sense amplifier 132 may present/receive data to/from the memory array 130 between an input/output 131 and an input/output 133. The sense amplifier 134 may present/receive data to/from the memory array 130 between an input/output 135 and an input/output 137.

The sense amplifiers 132 and 134 may be used in place of post decode address circuitry that may be found in conventional circuits. The sense amplifiers 132 and 134 may be implemented to transfer data to/from the array 130 to/from the west and east global data buses 104 and 106 in response to the BLKEN signal 103 and the AF0 signal 150. In one example, the sense amplifiers 132 and 134 may be implemented as 8-bit sense amplifiers. However, the sense amplifiers 132 and 134 may be implemented as any bit size in order to meet the criteria of a particular implementation. The memory array 130 may provide a similar operation for 8-bit sense amplifiers and 16-bit sense amplifiers. The sense amplifiers 132 and 134 may be implemented to multiplex, for example, a 16-bit memory array 130 to an 8-bit global data buses 104 (and/or 106).

Figure 5:
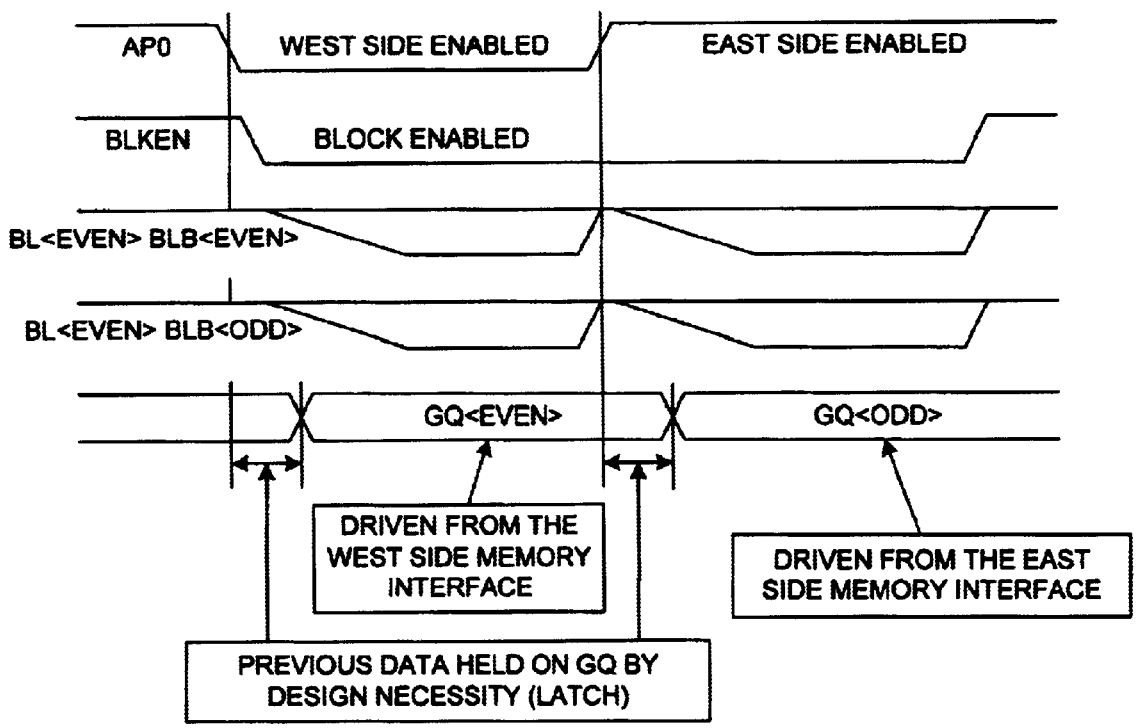
FIG. 5 is a timing diagram of the circuit of FIG. 3.

The memory 101 may present the data at the input/output 111 and/or the input/output 113 in response to the signal BLKEN received at the input 103 and the AP0 address signal 150. The memory 101 may also receive data at the input/output 111 and/or the input/output 113. The signal BLKEN may be presented to an inputs 160 and 161 of gates 166 and 165, respectively. In one example, the gates 165 and 166 may be implemented as NAND gates. However, other gates may be implemented accordingly to meet the design criteria of a particular implementation. The gate 165 may present a signal to an input 142 of the sense amplifier 132. The gate 166 may present a signal to an input 140 of the sense amplifier 134. While input 140 of sense amplifier 134 or input 140 of sense amplifier 142 are inactive, the sense amplifiers 132 and 134 generally tristate and cease to drive the global data busses. The memory array 130 may present data to the sense amplifier 132 and/or the sense amplifier 134 in response to a bitline (e.g., BL) and a bitline bar (e.g., BLB). The memory array 130 may store data in response to the bitline BL and the bitline bar BLB. FIG. 5 details a timing diagram which may define the interaction of the signal AP0 and the signal BLKEN on memory 101 and/or 102.

While the invention has been particularly shown and described with reference to the preferred embodiments thereof, it will be understood by those skilled in the art that various changes in form and details may be made without departing from the spirit and scope of the invention.

We claim:

1. An apparatus comprising:

a first bus configured to present/receive one or more first data packets;

a second bus configured to present/receive one or more second data packets;

a memory connected to said first and second bus, wherein said memory (i) comprises a plurality of memory sections each comprising a memory array and one or more amplifiers and (ii) is configured to transfer data to and receive data from said first and second buses; and one or more interconnections between (i) one or more data lines of said first bus and (ii) one or more data lines of said second bus to control a bit-width of said first and second buses.

2. The apparatus according to claim 1, wherein said one or more interconnections comprise a number of metal connections configured to communicate between said first and second buses.

3. The apparatus according to claim 1, further comprising a first input/output circuit connected to said first bus and a second input/output circuit connected to said second bus.

4. The apparatus according to claim 3, wherein said memory is configured to multiplex data to said first and second buses.

5. The apparatus according to claim 4, wherein said memory is further configured to read and write in response to an enable signal.

6. The apparatus according to claim 5, wherein said enable signal is generated in response to one or more address signals.

7. The apparatus according to claim 4, wherein:

said first bus is configured to present and/or receive data to and/or from said first input/output circuit; and said second bus is configured to present and/or receive data to and/or from said second input/output circuit.

8. The apparatus according to claim 1, wherein each of said one or more amplifiers comprises an 8-bit sense amplifier.

9. The apparatus according to claim 1, wherein said memory comprises an interdigitated memory array.

10. The apparatus according to claim 1, wherein each of said memory sections further comprises a first and a second bitline configured to read from and write to said memory sections in response to an enable signal.

11. The apparatus according to claim 1, wherein said memory comprises an interdigitated memory array.

12. The apparatus according to claim 1, wherein (i) said data lines of said first bus and said first bus comprise a first single ended data path and (ii) said data lines of said second bus and said second data bus comprise a second single ended data path.

13. A circuit comprising:

first means for presenting/receiving one or more first data packets over a first bus;

second means for presenting/receiving one or more second data packets over a second bus;

memory means connected to said first and second buses for transferring data to and receiving data from said first and second means for presenting/receiving, said memory means comprising a plurality of memory sections each comprising a memory array and one or more amplifiers; and means for configuring a bit-width of said first and second buses by connecting one or more data lines of said first bus with one or more data lines of said second bus.

14. A method configured to read from and write data to a memory comprising the steps of:

(A) reading/writing first data over a first bus;

(B) reading/writing second data over a second bus;

(C) storing/presenting said first and second data from said first and second buses in said memory, wherein said memory comprises a plurality of memory sections each comprising a memory array and one or more amplifiers; and (D) connecting one or more data lines of said first bus to one or more data lines of said second bus to configure a bit-width of said first and second busses.

15. The method according to claim 14, wherein said one or more data lines are connected using a plurality of metal connections, each configured to alter the bit-width of said first and second busses.

16. The method according to claim 14, further comprising the step:

(E) enabling said first and/or second busses in response to an enable signal.

* * * * *